US006947087B2

United States Patent
Egawa et al.

(10) Patent No.: US 6,947,087 B2
(45) Date of Patent: Sep. 20, 2005

(54) SOLID-STATE IMAGING DEVICE WITH DYNAMIC RANGE CONTROL

(75) Inventors: Yoshitaka Egawa, Yokohama (JP); Shinji Ohsawa, Ebina (JP); Yukio Endo, Yokohama (JP); Nobuo Nakamura, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 801 days.

(21) Appl. No.: 09/749,763

(22) Filed: Dec. 28, 2000

(65) Prior Publication Data

US 2001/0005227 A1 Jun. 28, 2001

(30) Foreign Application Priority Data

Dec. 28, 1999 (JP) ............................................ 11-375475

(51) Int. Cl.$^7$ ........................... H04N 3/14; H04N 5/335
(52) U.S. Cl. ......................... 348/304; 348/304; 348/308
(58) Field of Search ............................... 348/308, 394, 348/295, 296, 312, 297, 304, 302, 311, 301, 294, 298

(56) References Cited

U.S. PATENT DOCUMENTS

| | | | | |
|---|---|---|---|---|
| 4,974,093 A | * | 11/1990 | Murayama et al. | .......... 348/308 |
| 5,432,363 A | * | 7/1995 | Kamisaka et al. | .......... 257/233 |
| 5,552,827 A | * | 9/1996 | Maenaka et al. | ........... 348/266 |
| 5,572,256 A | * | 11/1996 | Egawa et al. | ................ 348/304 |
| 5,654,537 A | * | 8/1997 | Prater | ....................... 250/208.1 |
| 5,671,447 A | * | 9/1997 | Tokunaga | ..................... 396/51 |
| 5,729,287 A | * | 3/1998 | Morimoto | .................... 348/241 |
| 5,828,407 A | * | 10/1998 | Suzuki | ........................ 348/312 |
| 5,877,808 A | * | 3/1999 | Iizuka | .......................... 348/311 |
| 5,892,541 A | * | 4/1999 | Merrill | ........................ 348/302 |
| 6,037,577 A | * | 3/2000 | Tanaka et al. | ........... 250/208.1 |
| 6,215,520 B1 | * | 4/2001 | Taniji | .......................... 348/249 |
| 6,507,365 B1 | * | 1/2003 | Nakamura et al. | .......... 348/296 |
| 6,518,910 B2 | * | 2/2003 | Sakuragi et al. | ............. 341/162 |
| 6,606,122 B1 | * | 8/2003 | Shaw et al. | .................. 348/302 |
| 6,635,857 B1 | * | 10/2003 | Kindt | ....................... 250/208.1 |
| 6,646,683 B1 | * | 11/2003 | Mandle | ........................ 348/299 |
| 6,650,369 B2 | * | 11/2003 | Koizumi et al. | ............. 348/301 |
| 2001/0005227 A1 | * | 6/2001 | Egawa et al. | ................ 348/304 |
| 2002/0022938 A1 | * | 2/2002 | Butler | ........................... 702/85 |
| 2002/0158974 A1 | * | 10/2002 | Udo et al. | ................... 348/241 |

FOREIGN PATENT DOCUMENTS

JP 2000224492 A * 8/2000 .......... H04N/5/335

* cited by examiner

Primary Examiner—Wendy R. Garber
Assistant Examiner—Nelson D. Hernandez
(74) Attorney, Agent, or Firm—Oblon, Spivak, McClelland, Maier & Neustadt, P.C.

(57) ABSTRACT

A solid-state imaging device includes unit cells, arranged in a matrix of rows and columns, each having a photodiode for photoelectrically converting incident light to store signal charges, a readout transistor Td for reading out the signal charges and amplifying transistor Tb for amplifying signals readout at a detection node, a plurality of vertical shift registers for generating signal charge readout pulses ESi, DRi, ROi and a voltage switching circuit for setting a voltage VDR of the readout pulse DRi for dynamic range control lower than voltages of both a readout pulse ESi for an electronic shutter and a usual readout pulse ROi. The solid-state imaging device provides excellent images without clipping from a small signal region to large signal region.

10 Claims, 13 Drawing Sheets

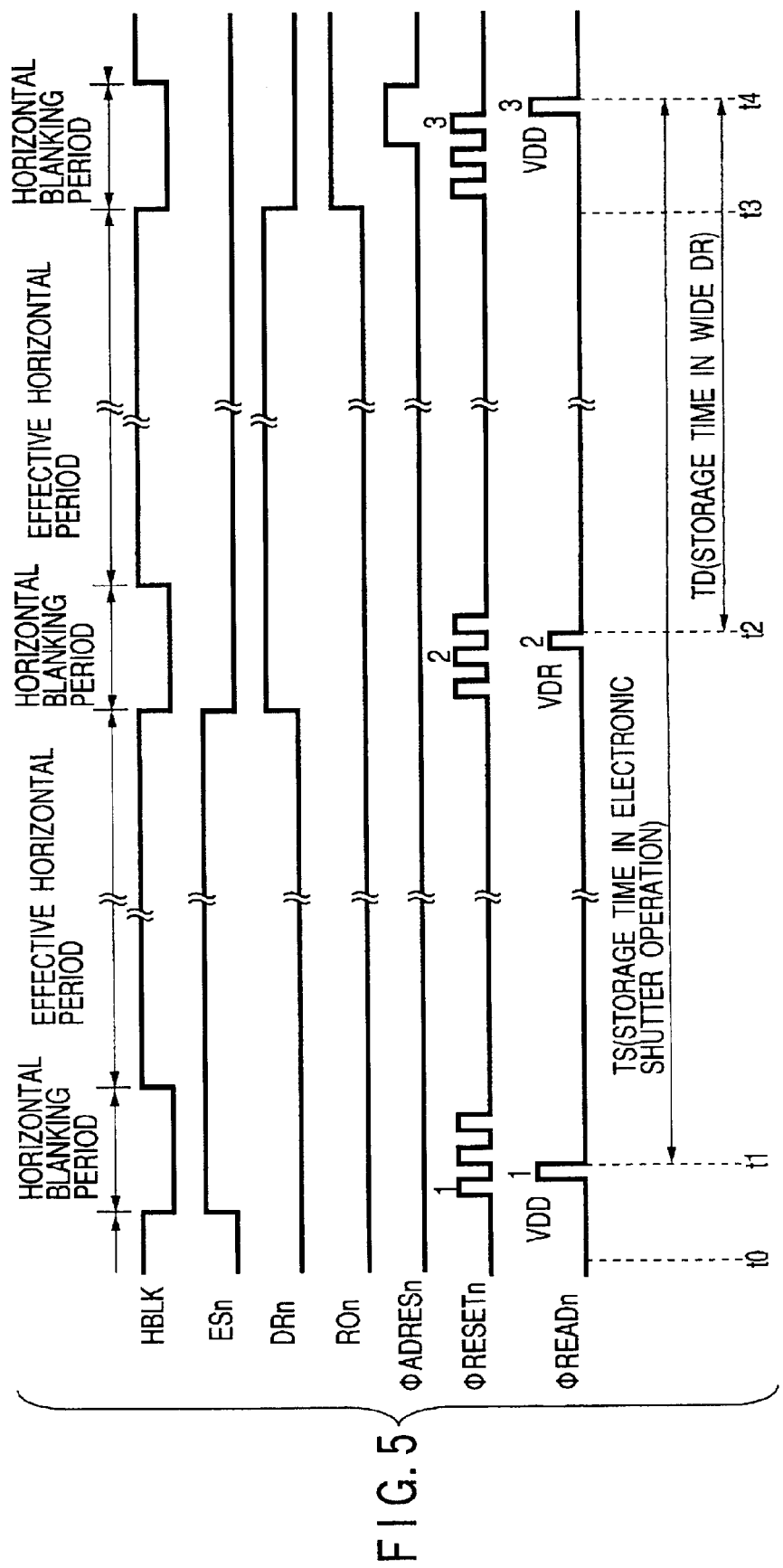
F I G. 5

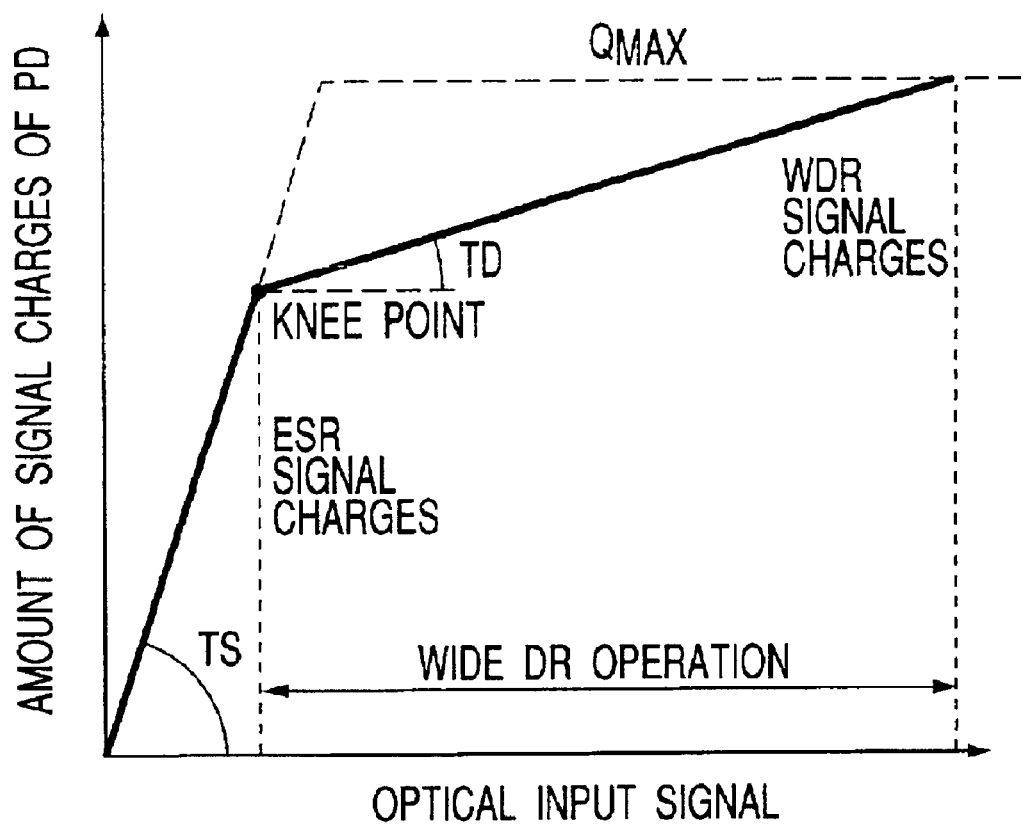
F I G. 7

SOLID-STATE IMAGING DEVICE WITH DYNAMIC RANGE CONTROL

CROSS-REFERENCE TO RELATED APPLICATIONS

This application is based upon and claims the benefit of priority from the prior Japanese Patent Application No. 11-375475, filed Dec. 28, 1999, the entire contents of which are incorporated herein by reference.

BACKGROUND OF THE INVENTION

The present invention relates to an amplification type solid-state imaging device for amplifying and extracting signals obtained by photoelectric conversion means, and especially a pixel signal readout driving circuit of CMOS type image sensor, which can be used for video cameras, electric still cameras or the like capable of electronic shutter control operation.

In recent years, the amplification type CMOS image sensor, known as solid-state imaging device appropriate for the application to video cameras, electric still cameras or the like, has a structure to amplify and extract signals obtained by the photoelectric conversion means for each cell by a MOS transistor. To be more specific, the charge detection node reads out the signal charges generated by the photoelectric conversion means, and the pixel cell itself is provided with the amplification function, by amplifying the potential of the detection node with the amplification transistor inside the pixel cell.

Such CMOS image sensor is still more expected, because it is highly sensitive and appropriate for minimization of the pixel by the increase of pixel number or reduction of the image size, in addition to its low power consumption.

FIG. 9 shows schematically a configuration of conventional 330 thousands pixel amplification type CMOS image sensor provided with a readout circuit capable of reading out a pixel signal for every one pixel.

In FIG. 9, the imaging region A includes unit cells 1 of one pixel/one unit arranged in a matrix of rows and columns. Each unit cell 1 is composed of, for instance, four transistors Ta, Tb, Tc, Td and one photodiode PD. In other words, each unit cell 1 comprises a photodiode PD that a ground potential is applied to its anode, a readout transistor (shutter gate transistor) Td whose one end is connected to the cathode of the photodiode PD, an amplifying transistor Tb whose gate is connected to the other end of the readout transistor Td, a vertical selection transistor (row selection transistor) Ta whose one end is connected to one end of the amplifying transistor Td, and a reset transistor Tc whose one end is connected to a gate of a amplifying transistor Tb.

In addition, the imaging region A comprises a readout line 4 connected in common to the gate of each readout transistor Td of the unit cell 1 in the same row, a vertical selection line 6 connected in common to the gate of each vertical selection transistor Ta of the unit cell 1 in the same row, and a reset line 7 connected in common to the gate of each reset transistor Tc of the unit cell 1 in the same row, in correspondence to each pixel row.

Further, the imaging region A includes a vertical signal line VLIN connected in common to the other end of each amplifying transistor Tb of the unit cell 1 in the same column, and a power supply line 9 connected in common to the other end of each reset transistor Tc and to the other end of respective vertical selection transistor Ta of the unit cell 1 in the same column, in correspondence to each pixel line.

Arranged in a horizontal direction in a first external region (not shown) of the imaging region A are a plurality of load transistors TL each of which is connected between each one end of the vertical signal line VLIN and the ground node to which gate a bias voltage VVL is applied.

Moreover, a plurality of noise canceller circuits composed, for instance, of two transistors TSH, TCLP and two capacitors Cc, Ct are arranged in the horizontal direction, in the second external region (not shown) of the imaging region A. And, a plurality of horizontal selection transistor TH connected to respective other end of the vertical signal line VLIN through the noise canceller circuit are arranged in the horizontal direction.

Further, a horizontal signal line HLIN is connected in common to the other end of the horizontal selection transistor TH, and a horizontal reset transistor (not shown) and an output amplification circuit AMP are connected to the horizontal signal line HLIN.

Here, the respective noise canceller circuit is comprised of a sample hold transistor TSH whose one end is connected to the other end of the vertical signal line VLIN, a coupling capacitor Cc whose one end is connected to the other end of the sample hold transistor TSH, a charge storage capacitor Ct connected between the other end of the coupling capacitor Cc and the ground node, and a potential clamp transistor TCLP whose one end is connected to the connection node of these two capacitors Cc, Ct and whose the other end is supplied with bias voltage VVC, and one end of the horizontal selection transistor TH is connected to the connection node of two capacitors Cc, Ct.

Also, arranged in a third external region (not shown) of the image region A are a vertical shift register 2 for selecting and controlling a plurality of vertical selection line 6 of the imaging region, a pulse selector 2a for driving the readout line 4 or the like of each row of the imaging region by selecting and controlling the output pulse of the vertical shift register 2, and a horizontal shift register 3 for driving the horizontal selection transistor TH.

Further, arranged in a fourth external region (not shown) of the imaging region A are a timing generation circuit 10 for generating various internal signals, based on an external input pulse signal at a predetermined timing, and supplying to the pulse selector 2a, the horizontal shift register 3, the noise canceller circuit or the like, and a bias generation circuit 11 for generating a predetermined bias potential at one end or other of the potential clamp transistor TCLP of the noise canceller circuit.

FIG. 10 is a timing waveform diagram showing an example of the operation of the solid-state image sensor shown in FIG. 9. Now, referring to FIG. 10, the operation of the solid-state image sensor shown in FIG. 9 will be described.

Signal charges generated by photoelectric conversion of incident light are stored in the photodiode PD.

In the horizontal blanking period, when the signal charges of the photodiode PD are read out from the unit cell 1 of any one row, first, each vertical signal line VLIN is selected. Next, the signal line (φADRESi) of the vertical selection line 6 of the row to be selected is selected, and a vertical selection pulse signal φADRES is applied thereto, thereby turning on the line selection transistors Ta of one row.

For the unit cell 1 of one row thus selected, a source follower circuit, comprised of the amplifying transistor Tb and the load transistor TL supplied with power supply potential VDD (for instance 3.3V) through the row selection transistor Ta, is operated.

Next, in the unit cell 1 of one row thus selected, a reset pulse signal φRESET is applied by selecting the signal line (φRESETi) of the reset line 7, and the voltage of the gate of the amplifying transistor Tb (signal detection node DN) is reset to the reference voltage for a fixed period, thereby providing the reference voltage to the vertical signal line VLIN. However, the gate potential of the amplifying transistor Tb of the unit cell 1 of one row reset here is changed, and the reset potential of the vertical signal line VLIN of its other end with become uneven.

Therefore, to compensate the unevenness of the reset potential of the vertical signal line VLIN, the driving signal (φSH pulse) of the sample hold transistor TSH in the noise canceller circuit is previously turned on. Moreover, the connection node of capacitors Cc, Ct of the noise canceller circuit is set to the reference voltage, by turning on for a predetermined time the driving signal (φCLP pulse) of the potential clamp transistor TCLP after the reference voltage is output to the vertical signal line VLIN.

Next, the readout transistor Td is turned on by turning on the signal line (φREADi) thereof by selecting the readout line 4 of a predetermined row synchronizing with the readout pulse signal φREAD, after turning off the signal line (φRESETi) of the reset line 7, and the gate potential is changed by reading out the stored charges of the photodiode PD to the gate of the amplifying transistor Tb. The amplifying transistor Tb provides a voltage signal corresponding to the change amount of the gate potential to the corresponding vertical signal line VLIN and noise canceller circuit.

Thereafter, by turning off φSH pulse in the noise canceller circuit, a signal component corresponding to the difference between the read reference voltage and the signal voltage, in other words, the signal voltage without noise is stored in the capacitor Ct for the charge storage capacitor until the corresponding horizontal selection transistor TH is turned on.

Then, by turning off the signal line (φADRESi) of the vertical selection line 6 and controlling the vertical selection transistor Ta to off state to set the unit cell to non-selected state, the imaging region and each noise canceller circuit are disconnected electrically.

During the following effective horizontal period, after the reset by the horizontal reset signal HRS from the timing generation circuit 10, the horizontal shift register 3 performs the shift operation in synchronization with the horizontal timing signal HCK. This allows to turn on sequentially the driving signal (φH pulse) of the horizontal selection transistor TH and turn on the horizontal selection transistor TH sequentially.

In this way, the signal voltage of the connection node (signal conservation node) of the capacitors Cc, Ct in the noise canceller circuit is read out sequentially on the horizontal signal line HLIN, amplified and output by the output amplification circuit AMP. Here, the aforementioned noise elimination operation is performed for each readout operation by one horizontal line.

FIG. 11 is a timing waveform diagram showing an example of operation of the timing generation circuit 10 and the vertical shift register 2 in FIG. 10. Here, a case where the CMOS image sensor of FIG. 9 is used by VGA (Video Graphic Array) system of one field (frame)=1/30 Hz is shown.

Pulse signal φHP of 15.7 KHZ and clock signal φCK of 24 MHz input from outside are shaped by a buffer circuit (not shown) and are input to the timing generation circuit 10. Pulse signal φVR of 30 KHZ and pulse signal φHP of 15.7 KHZ input from outside are shaped by a buffer circuit (not shown) and are input to the vertical shift register 2.

The vertical shift register 2 clears completely the register output during "L" level period of the input pulse signal φVR and sets to "L" level, then performs the shift operation by the pulse signal φHP to set the output pulse signal ROi (i=..., n, n+1,...) to "H" level sequentially and the output pulse signal ROi is applied to the pulse selector 2a.

The pulse selector 2a selects the signal line (φADRESi) of the vertical selection line 6, the signal line (φRESETi) of the reset line 7 and the signal line (φREADi) of the readout line 4 for each selected row, and scans the selected row.

As mentioned above, the CMOS image sensor of FIG. 9 provides only once the respective output pulse signal ROi of the vertical shift register 2 for selecting and controlling a specific selected row within one field period. Namely, as the photodiode PD discharges the stored charges only one by one field, it is impossible to perform an electronic shutter operation for controlling the exposure time by controlling the signal storage time in the photodiode PD.

However, in general, solid-state imaging devices such as COMS image sensor are often used under various external light such as, indoor or in open air, or further, daytime or night time. Therefore, the electronic shutter operation for adjusting the exposure time and, consequently, setting the sensitivity to the optimal value by controlling the charge storage period in the photodiode according to the variation of external light or the like, is often required.

Therefore, in addition to the vertical shift register 2 for providing the output pulse signal ROi, if a vertical shift register for the electronic shutter for selecting and controlling each pixel row prior to the vertical shift register 2 is provided to the aforementioned CMOS image sensor of FIG. 9, the photodiode signal storage time of each pixel row can be controlled based on respective output pulse signals from these two vertical shift registers, allowing, as a result, to perform the electronic shutter operation.

Now, a configuration of an amplification type CMOS image sensor capable of electronic shutter operation will be shown schematically in FIG. 12 and, the operation waveform of the vertical shift register in FIG. 12 will be shown in FIG. 13.

In FIG. 12, the pulse signal φES of 30 KHZ and the pulse signal φHP of 15.7 KHZ input from outside are shaped respectively by a buffer circuit (not shown) and applied to the vertical shift register 20 for the electronic shutter at both the field period and the horizontal period. This vertical shift register 20 for the electronic shutter clears completely the register output during "L" level period of the input pulse signal φES and sets to "L" level, then performs the shift operation by the pulse signal φHP to set the output pulse signal ESi (i=..., n, n+1,...) to "H" level sequentially and input to the pulse selector 2a.

The pulse selector 2a scans the pixel row of the signal line (φRESETi) of the imaging region so as to select the reset line 7 and the signal line (φREADi) of the readout line 4 for the pixel row where the output pulse signals ROi, ESi from two vertical shift registers 2, 20 are of "H" level. In this case, for the signal line (φADRESi) of the vertical selection line 6, only the row to be selected where the output pulse signal ROi from the readout vertical shift register 2 is "H" level is selected and scanned.

Thus, as shown in FIG. 13, the signal line (φREADi) of the readout line 4 in each pixel row is turned on twice within one field period by two vertical shift registers 2, 20. Namely, as the signal storage timing and the signal readout timing can be set in correspondence respectively to the output pulse signals ROi, ESi from the vertical shift register 20 for the electronic shutter and the readout vertical shift register 2, consequently, the electronic shutter operation for controlling the charge storage time in the photodiode can be obtained.

As mentioned above, in the CMOS image sensor shown in FIG. 12, a readout driving signal is output from the pulse selector 2a to the readout line 4 in synchronization with the readout pulse signal φREAD supplied from the timing generation circuit 10, for either of signal storage timing or signal readout timing. This allows to perform the electronic shutter operation for controlling the charge storage time in the photodiode by 1H unit.

On the other hand, it is highly expected that the CMOS image sensor be used in an environment where incident light amount is extremely abundant such as daytime outdoor, and it is required to obtain always a good image without risk of clipping of the high brightness side even under such environment. For this sake, it is desirable to realize a rapid electronic shutter operation reducing the charge storage time of the photodiode to less than 1H.

Considering such situation, the Applicant has proposed a solid-state imaging device (Japan Patent Application No. 11-286469) capable of controlling the minimum charge storage time of the photodiode to less than 1H and performing an extremely high speed electronic shutter operation.

By the way, the aforementioned CMOS image sensor shown in FIG. 9 or FIG. 12 has a problem of low dynamic range that a person by the window photographed from indoor is imaged dark, and when the sensitivity is focused to the person, the scenery of the window will become white and can not be reproduced. Moreover, as the dynamic range is determined by the signal charge amount stored in an unit cell, the capacity of the signal storage portion will be lowered to reduce the saturated signal amount and the dynamic range when the pixel cell size is reduced or the driving voltage is lowered. This low dynamic range will prevent from imaging from the small signal to large signal area.

The Applicant has already proposed a technique for resolving the problem of such low dynamic range (Japan Patent Application No. 10-185121). The technique according to the proposal is that a part of the amount of charges, read out at the signal detection node produced by the photodiode for a certain period, is removed to limit the charges at the signal detection node and that charges produced by the photodiode after this period are read out to add them to the charges stored at the signal detection node. However, it is desired that a system for increasing the dynamic range suitable for the readout driving control in the amplification type CMOS image sensor.

BRIEF SUMMARY OF THE INVENTION

The present invention has been made to eliminate the above problems, and it is an object of the present invention to provide a solid-state imaging device capable of increasing remarkably the dynamic range of amplification type CMOS image sensor, and obtaining a good image over small signal to large signal without being clipped.

It is another object of the present invention to provide a solid-state imaging device capable of increasing remarkably the dynamic range while carrying out the electronic shutter operation in the amplification type CMOS image sensor, and obtaining a good image from small signal to large signal without being clipped.

According to one aspect of the present invention, there is provided a solid-state imaging device which comprises an imaging region including unit cells arranged in a matrix of rows and columns to provide a plurality of pixel rows, each of the unit cells having photoelectric conversion means for photoelectrically converting incident light, applied to pixels to store signal charges, readout means for reading out stored signal charges at a detection node, and amplifying means for amplifying read signals; and a readout voltage switching circuit for setting readout driving signals, applied to the readout means, to any one of a plurality of voltages different from one another according to internal control.

According to another aspect of the present invention, there is provided a second solid-state imaging device which comprises an imaging region including unit cells arranged in a matrix of rows and columns to provide a plurality of pixel rows, each of the unit cells having photoelectric conversion means for photoelectrically converting incident light, applied to pixels to store signal charges, readout means for reading out stored signal charges at a detection node, and amplifying means for amplifying read signals; a plurality of readout lines provided in a horizontal direction corresponding to each pixel row in the imaging region, the plurality of read lines transmitting readout driving signals for driving respective readout means of the unit cell in respective corresponding pixel row; a pulse production circuit for producing a plurality of pulses for respective pixel rows as pulse signals for controlling readout timing in the plurality of pixel rows; a readout voltage switching circuit for setting a readout driving signal voltage, applied to the readout means corresponding to a part of a plurality of pulses, to a voltage different from the readout driving signal voltage applied to the readout means according to the other pulse of the plurality of pulses; and a plurality of vertical signal lines, disposed in correspondence to respective pixel column in the imaging region, for transmitting in the vertical direction signals output respectively from the unit cell of each pixel row.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a waveform diagram showing signals remarking the operation of n th horizontal line in an imaging region of the CMOS image sensor of FIG. 1;

FIG. 7 is a characteristic showing an example of photoelectric conversion characteristic of the CMOS image sensor of FIG. 1;

DETAILED DESCRIPTION OF THE INVENTION

Figure 1:
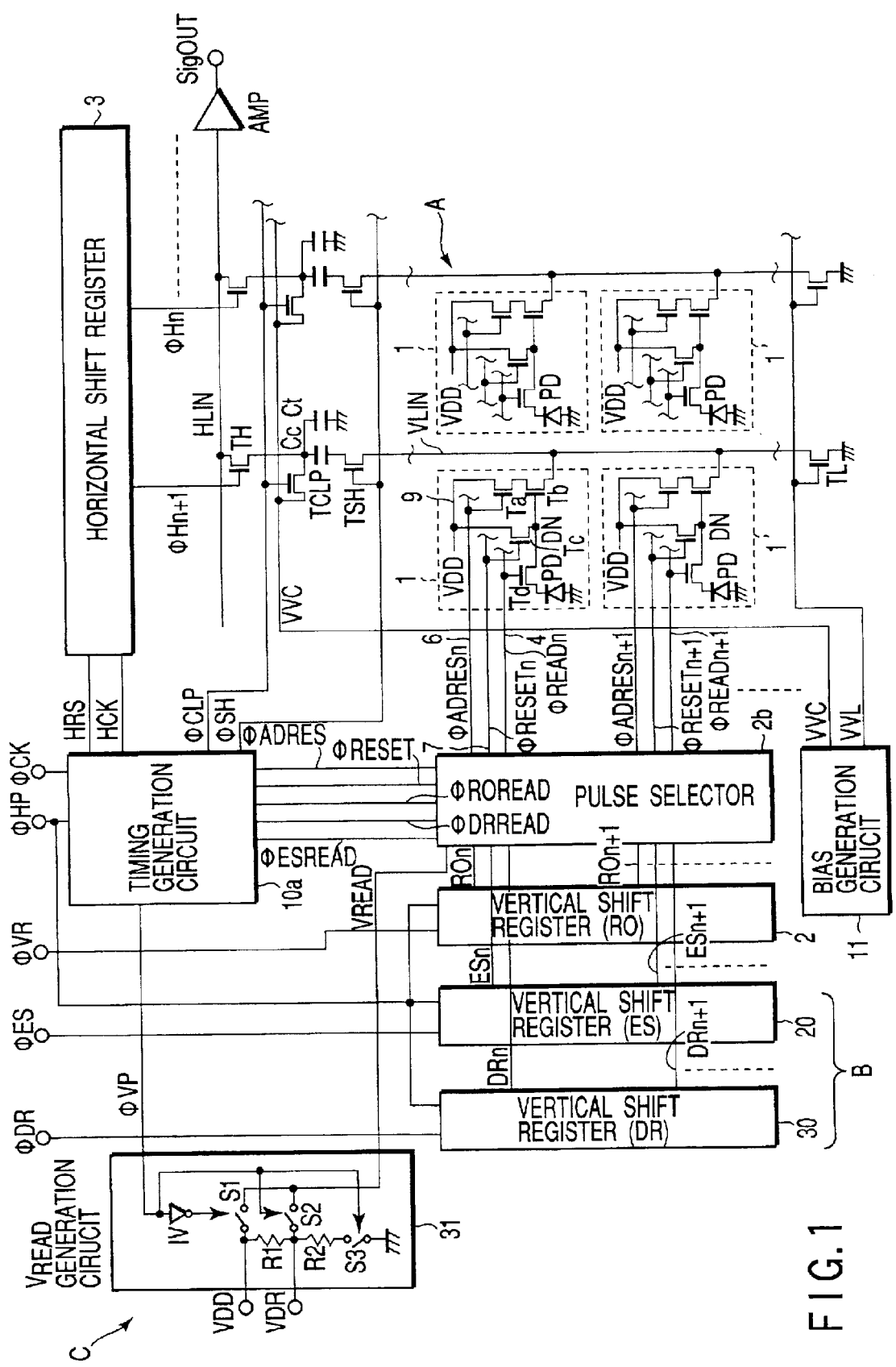
FIG. 1 is a block diagram showing schematically an amplification type CMOS image sensor according to a first embodiment of the present invention.

Embodiments of the present invention will be described in detail with reference to the drawing.

FIG. 1 is a block diagram showing schematically an amplification type CMOS image sensor according to a first embodiment of the present invention.

Figure 12:
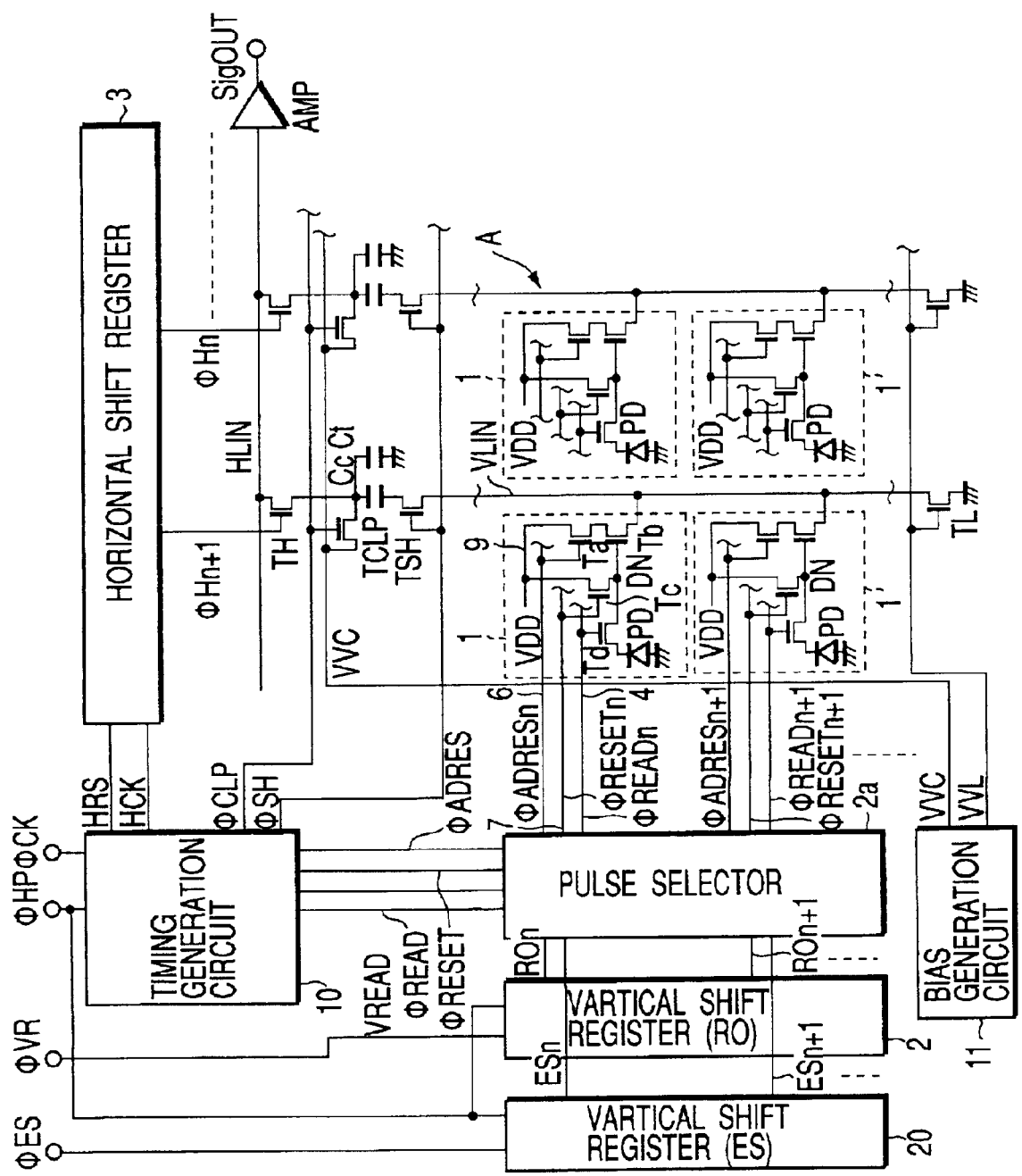
FIG. 12 is a block diagram showing schematically a configuration of an amplification type CMOS image sensor capable of electronic shutter operation.
Figure 13:
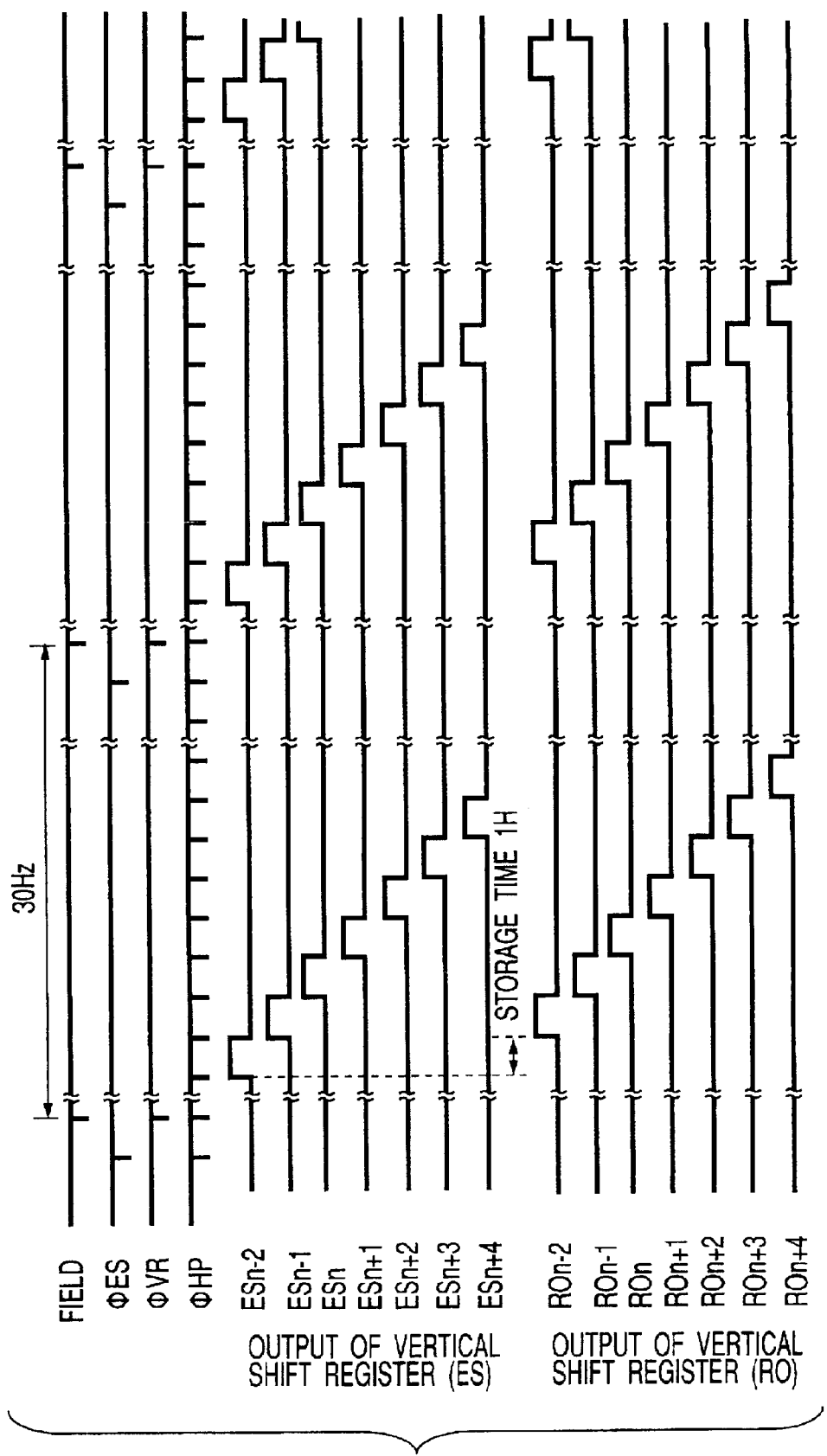
FIG. 13 is a timing waveform diagram for showing the operation of the vertical shift register in FIG. 12.

Compared to the CMOS image sensor shown in FIG. 12, the CMOS image sensor of FIG. 1 is mostly similar to except the following points, and those same as in FIG. 12 have the same reference numerals.

(1) A vertical shift register 30 is provided for generating sequentially pulses DRi (i=..., n, n+1, ...) of a dynamic range control, based on the external input pulse φDR.

Namely, the image sensor includes a pulse generation circuit B comprised of three vertical shift registers 2, 20, 30 for producing three pulses ESi, DRi, ROi for respective pixel rows, as a pulse signal source for controlling the readout timing in the readout transistor Td.

(2) A voltage VDR of a readout driving signal is applied to the readout transistor Td corresponding to the pulse DRi of the dynamic range control. In order to set the voltage VDR to a lower voltage than a voltage VDD of the readout driving signal applied to the readout transistor Td in correspondence to the pulse ESi for the electronic shutter and the pulse ROi for usual readout, a VREAD generation circuit 31 is provided.

Namely, a readout voltage switching circuit C is provided, which has the function to control the readout driving signal voltage (readout voltage VREAD) applied to the readout transistor Td to either voltage of a plurality of voltage values VDD, VDR.

Here, a concrete example of the VREAD generation circuit 31 which is the readout voltage switching circuit C will be described. A voltage VDD is applied to one end of the voltage dividing circuit where resistors R1, R2 are connected in series, and an output node is connected to this one end through a switch S1. The series connection node of the resistors R1, R2 is connected to the output node through a switch S2, and the other end of the voltage dividing circuit is connected to the ground node through a switch S3. The switches S2, S3 are controlled by the control signal φVP, and the switch S1 is controlled by a signal obtained by inverting the switching control signal φVP with an inverter circuit IV.

Thereby, when S1 is controlled to ON state among switches S1, S2, S3 and S2 and S3 are OFF state, VDD is output to the output node as VREAD, and when S2 and S3 are controlled to ON state and S1 to OFF state, VDD is divided and VDR is output to the output node as VREAD.

(3) The pulse selector circuit 2b is operated as vertical driving means for selecting the output signals ROi, ESi, DRi of three vertical shift registers 2, 20, 30 and providing the readout driving signal set to the readout voltage VREAD (VDD or VDR) supplied from the VREAD generation circuit 31.

(4) The timing generation circuit 10 is provided to have a function to supply the VREAD generation circuit 31 with the switching control signal φVP and the pulse selector circuit 2b with a pulse signal φDRREAD of the dynamic range control.

Namely, in FIG. 1, the imaging region A includes units cells 1 of one pixel/one unit arranged in a matrix of rows and columns. Each unit cell 1 is comprised of, for example, four transistors Ta, Tb, Tc, Td and one photodiode PD. Namely, each unit cell 1 comprises a photodiode PD that the ground potential is applied to the anode, a readout transistor (shutter gate transistor) Td whose one end is connected to the cathode of the photodiode PD, an amplifying transistor Tb whose gate is connected to the other end of the readout transistor Td, a vertical selection transistor (row selection transistor) Ta whose one end is connected to one end of the amplifying transistor Td, and a reset transistor Tc whose one end is connected to the gate of the amplifying transistor Tb.

In addition, the imaging region A comprises a readout line 4 connected in common to the gate of each readout transistor Td of the unit cells 1 in the same row, a vertical selection line 6 connected in common to the gate of each vertical selection transistor Ta of the unit cells 1 in the same row, and a reset line 7 connected in common to the gate of each reset transistor Tc of the unit cells 1 in the same row, in correspondence to each pixel row.

Moreover, the imaging region A includes a vertical signal line VLIN connected in common to the other end of each amplifying transistor Tb of the unit cells 1 in the same row, and a power supply line 9 connected in common to the other end of each reset transistor Tc and to the other end of each vertical selection transistor Ta of the unit cells 1 in the same row, in correspondence to each pixel column.

Further, arranged in the horizontal direction in the first external region (not shown) are a plurality of load transistors TL connected respectively between one end of the vertical signal line VLIN and the ground node and supplied with bias voltage VVL at the gate.

Moreover, a plurality of noise canceller circuits comprised of, for instance, two transistors TSH, TCLP and two capacitors Cc, Ct are arranged in the horizontal direction in the second external region (not shown) of the imaging region A. And, a plurality of horizontal selection transistors TH connected to respective other ends of the vertical signal line VLIN through each noise canceller circuit are arranged in the horizontal direction.

Further, a horizontal signal line HLIN is connected in common to each other end of the horizontal selection transistors TH, and a horizontal reset transistor (not shown) and an output amplifying circuit AMP are connected to the horizontal signal line HLIN.

Here, each noise canceller circuit includes a sample hold transistor TSH whose one end is connected to the other end of the vertical signal line VLIN, a coupling capacitor Cc whose one end is connected to the other end of the sample hold transistor TSH, a charge storage capacitor Ct connected between the other end of the coupling capacitor Cc and the ground node, and a potential clamp transistor TCLP whose one end is connected to the connection node of these two capacitors Cc, Ct and whose other end is supplied with bias voltage VVC, and one end of the horizontal selection transistor TH is connected to the connection node of the two capacitors Cc, Ct.

Also, arranged in the third external region (not shown) of the imaging region A are the readout vertical shift register 2 for selecting and controlling a plurality of vertical selection lines 6 of the imaging region, the vertical shift register 20 for the electronic shutter, the vertical shift register 30 for the dynamic range control, the pulse selector 2b for driving the readout line 4 or the like of each row of the imaging region by selecting and controlling the output pulses of the three vertical shift registers 2, 20, 30, and the horizontal shift register 3 for driving a plurality of horizontal selection transistors TH.

Further, arranged in the fourth external region (not shown) of the imaging region A are the timing generation circuit 10a for generating various internal control signals (φROREAD, φESREAD, φDSREAD, φRESET, φADRES to be supplied to pulse selector 2b; φSH, φCLP to be supplied to the noise canceller circuit; φVP to be supplied to the VREAD generation circuit 31; pulse signals, HRS, HCK to be supplied to the horizontal shift register 3 or other pulse signals) at a predetermined timing, based on the external input pulse signals φHP, φCK, thereby supplying the pulse selector 2b, the horizontal shift register 3, the noise canceller circuit, VREAD generation circuit 31 or the like therewith, and the bias generation circuit 11 for generating a predetermined bias potential at one end or other of the potential clamp transistor TCLP of the noise canceller circuit.

The vertical shift register 20 for the electronic shutter clears completely the register outputs during "L" level period of φES and sets to "L" level when the external input pulse signals φES, φVR are shaped respectively by a buffer circuit (not shown) and input at the field and horizontal periods. The shift register carries out then the shift operation by the pulse signal φHP to set the output pulse signal ESi (i=..., n, n+1,...) to "H" level sequentially and provides to the pulse selector 2b. In this example, the pulse signal ESi for the electronic shutter is produced during the horizontal blanking period.

The vertical shift register 30 for dynamic range control clears completely the register outputs during "L" level period of φDR and sets to "L" level when the external input pulse signals DR, HP are shaped respectively by the buffer circuit (not shown) and input at field and horizontal periods, then carries out the shift operation by the pulse signal φHP to set the output pulse signal DRi (i=..., n, n+1,...) to "H" level sequentially and input to the pulse selector 2b. In this example, the pulse signal DRi for the dynamic range control is produced during the horizontal blanking period.

The vertical shift register 2 for readout clears completely the register outputs during "L" level period of φVR and sets to "L" level when the external input pulse signals φVR, φHP are shaped respectively by the buffer circuit (not shown) and input at field and horizontal periods, then performs the shift operation by the pulse signal φHP to set the output pulse signal ROi (i=..., n, n+1,...) to "H" level sequentially and input to the pulse selector 2b. In this example, the pulse signal ROi for readout is produced during the horizontal blanking period.

Then, the VREAD generation circuit 31 receiving φVP pulse from the timing generation circuit 10a changes over the readout voltage VREAD to VDD or VDR and supplies the pulse selector 2b therewith. In this case, VREAD is set to VDD during "L" period of φVP and VREAD is set to VDR lower than VDD during "H" period of φVP.

Figure 2:
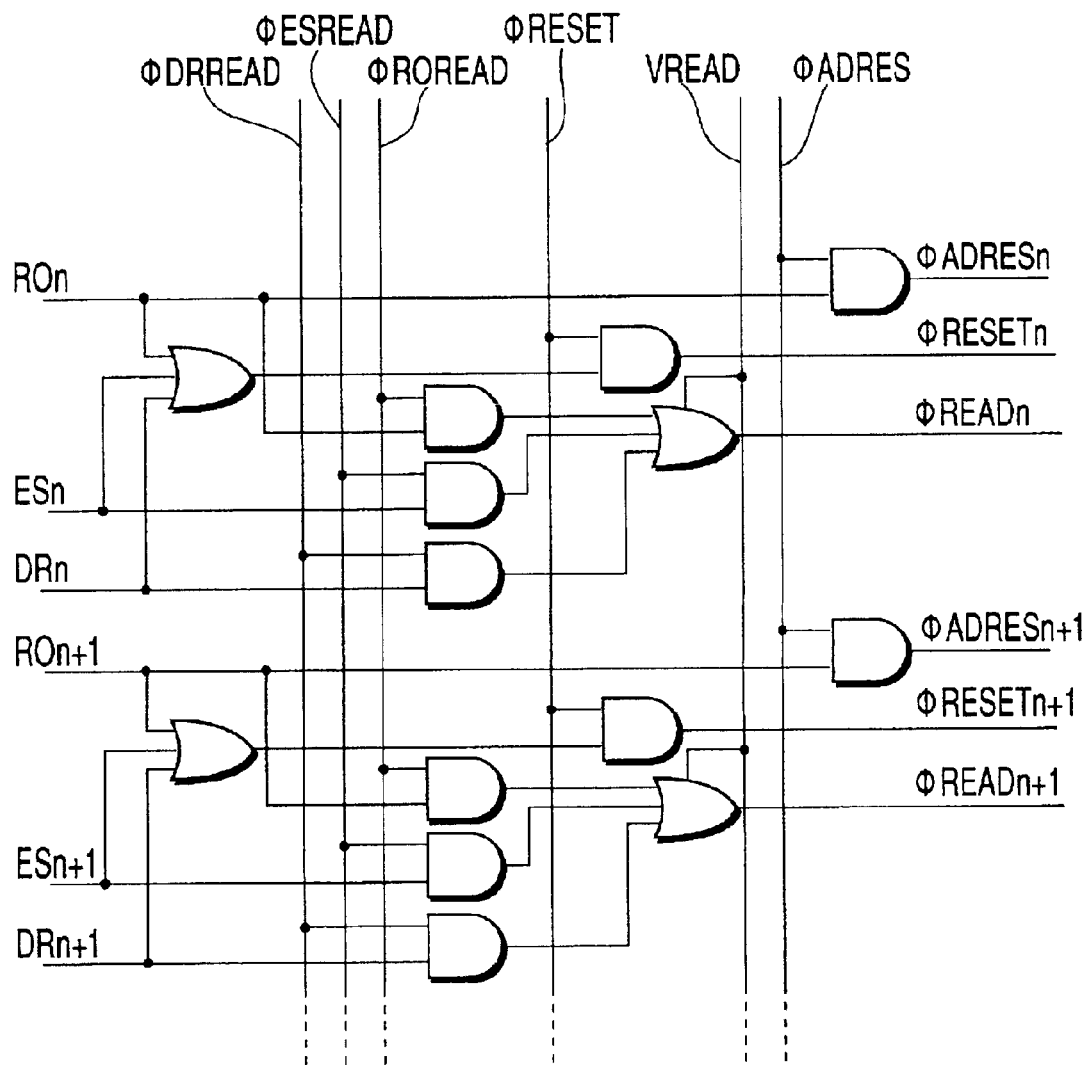
FIG. 2 is a circuit showing an example of pulse selector in FIG. 1.

FIG. 2 is a circuit showing an example of pulse selector 2b in FIG. 1.

As shown in FIG. 2, input to the pulse selector 2b are the output signal ESi (ESn in this example) of the vertical shift register 20 for the electronic shutter, the output pulse signal DRi (DRn in this example) of the vertical shift register 30 for the dynamic range control and the output pulse signal ROi (ROn in this example) of the readout vertical shift register 2, and further input to the pulse selector 2b are the timing signals φADRES, φRESET, φESREAD, φDRREAD, φROREAD supplied from the timing generation circuit 10a. The logic processing of these input signals is carried out to provide (supply to the imaging region) the vertical selection line driving signal φADRESi (i=..., n, n+1,...), the reset signal φRESETi (i=..., n, n+1,...) and readout driving signal φREADi (i=..., n, n+1,...), thereby constituting a logic gate.

Namely, when the output signal ESi of the vertical shift register 20 for the electronic shutter is in ON state, the timing signal φESREAD is selected to provide the driving signal φESREADi, when the output signal DRi of the vertical shift register 30 for the dynamic range control is in ON state, the timing signal φDRREAD is selected to provide the driving signal φDRREADi, and when the output signal ROi of the vertical shift register 2 for the readout is in ON state, the timing signal φROREAD is selected to provide the driving signal φROREADi respectively. VREAD controls the voltage amplitude of these readout driving signals φREADi and the voltages of φESREADi and φROREADi are VDD and the voltage of φDRREADi is VDR.

When any one of the output signal ESi of the vertical shift register 20 for the electronic shutter, the output signal DRi of the vertical shift register 30 for the dynamic range control or the output signal ROi of the vertical shift register 2 for readout is in ON state, the timing signal φRESET is selected and output as the reset signal φRESETi.

When the output signal ROi of the vertical shift register 2 for readout is in ON state, the timing signal φADRES is selected and output as the vertical selection line driving signal φADRESi.

An operation of the CMOS image sensor of FIG. 1 will be described.

Figure 9:
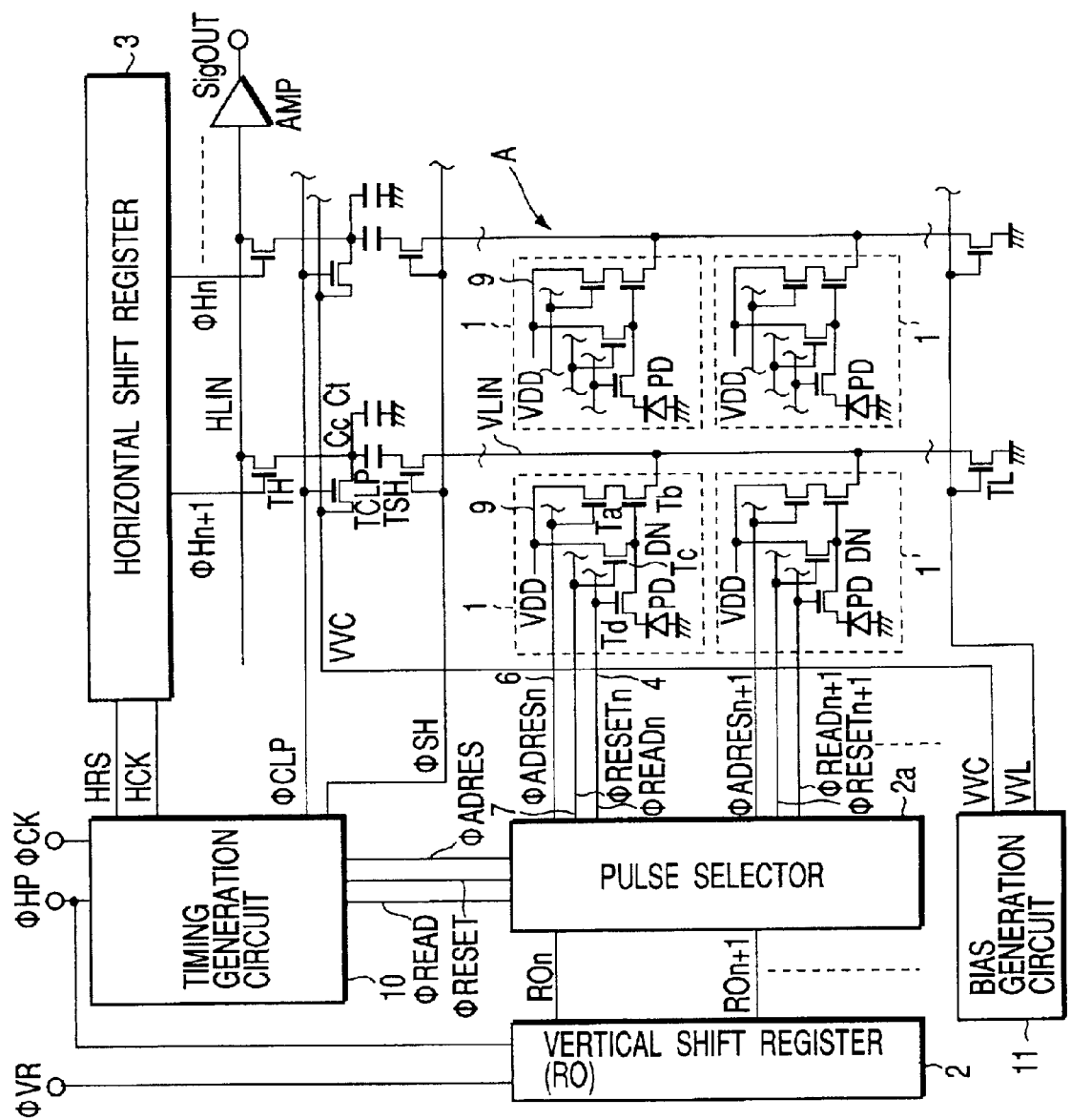
FIG. 9 is a block diagram showing schematically a conventional amplification type CMOS image sensor.
Figure 10:
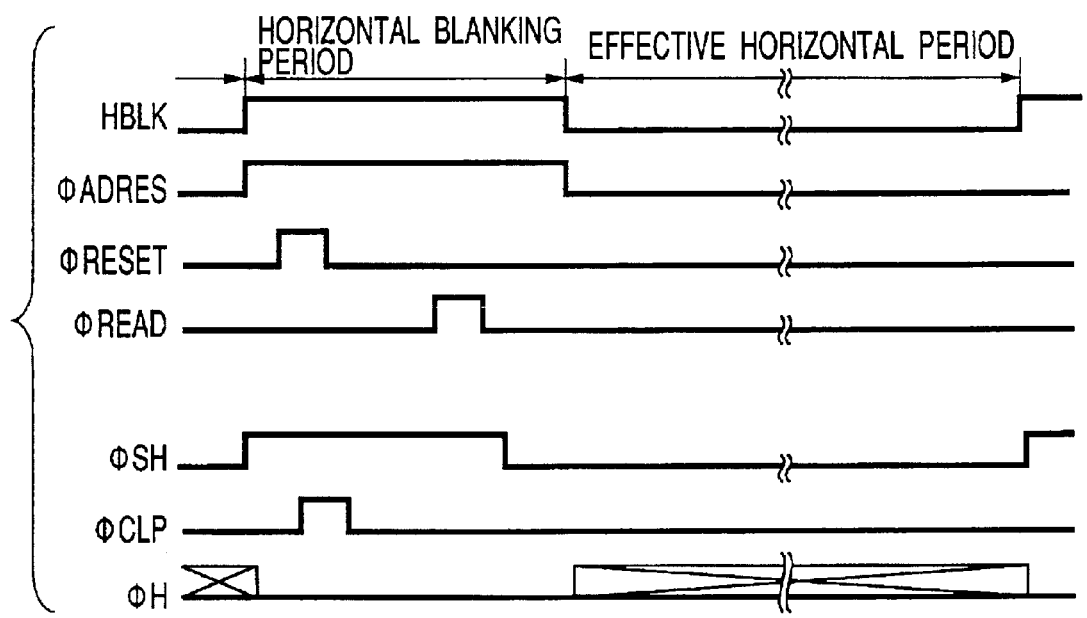
FIG. 10 is a timing waveform diagram showing an example of the operation of the solid-state image sensor shown in FIG. 9.
Figure 11:
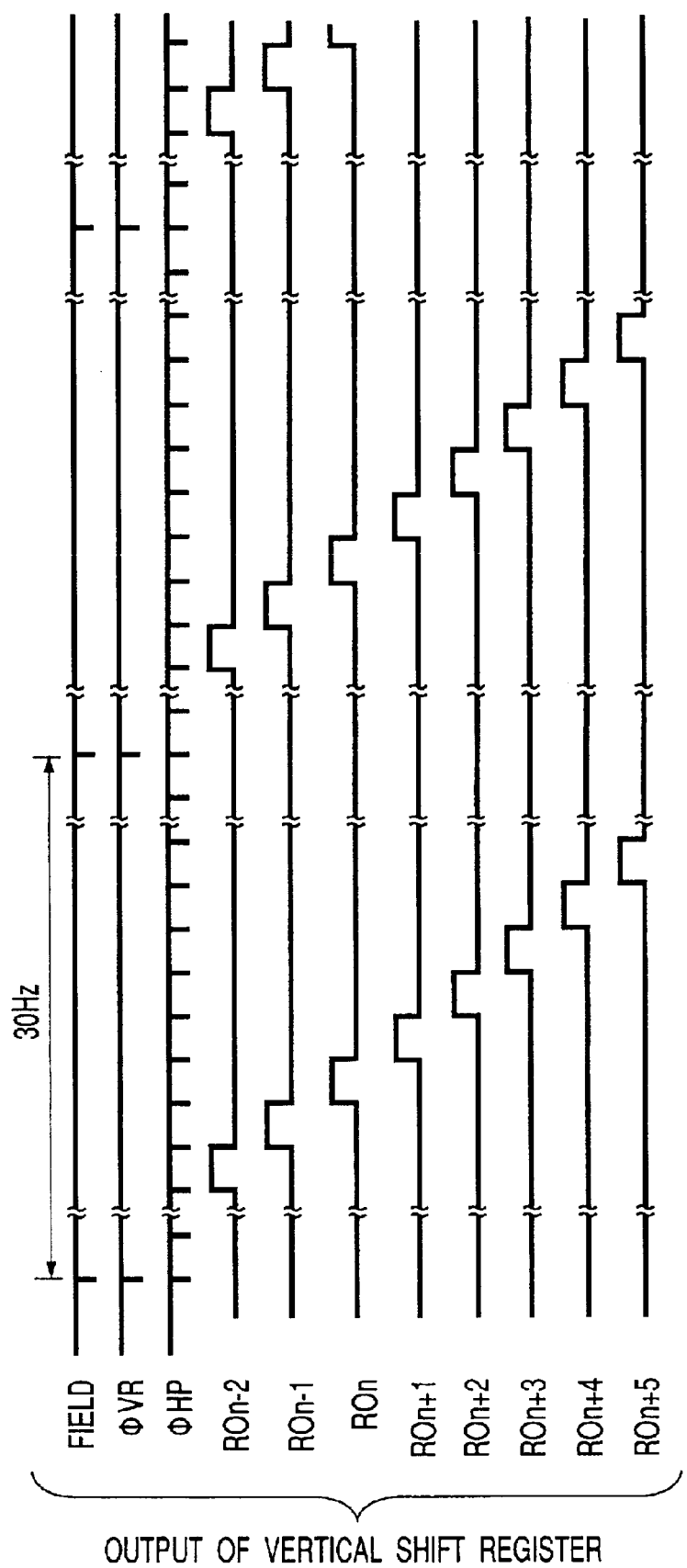
FIG. 11 is a timing waveform diagram showing an example of the operation of the timing generation circuit and a vertical shift register in FIG. 10.

The basic operation of the CMOS image sensor of FIG. 1 is same as the operation of the CMOS image sensor described referring to FIG. 9, so the outline thereof will be described here.

First, φADRESi is turned ON to operate the source follower circuit. Next, φRESETi is turned ON to reset the signal detection node DN. Thereafter, the potential of the signal detection node DN is output as a reference voltage. At this time, φSH and φCLP are turned ON and the reference voltage is set by the noise canceller circuit.

Next, the signal charges stored by the photoelectric conversion through the photodiode PD are read out by turning ON φREADi, and output to the noise canceller circuit through the amplifier transistor Tb and the source follower circuit. The signal voltage output to the noise canceller circuit can be stored in the capacitor Ct during the effective period, by turning OFF ASH. Signal voltage stored in the capacitor Ct is output to the horizontal signal line HLIN by sequentially applying φHi to the horizontal selection transistor TH during the effective period.

Now, the characterizing portion of the operation of the CMOS image sensor in FIG. 1 will be described in detail.

Figure 3:
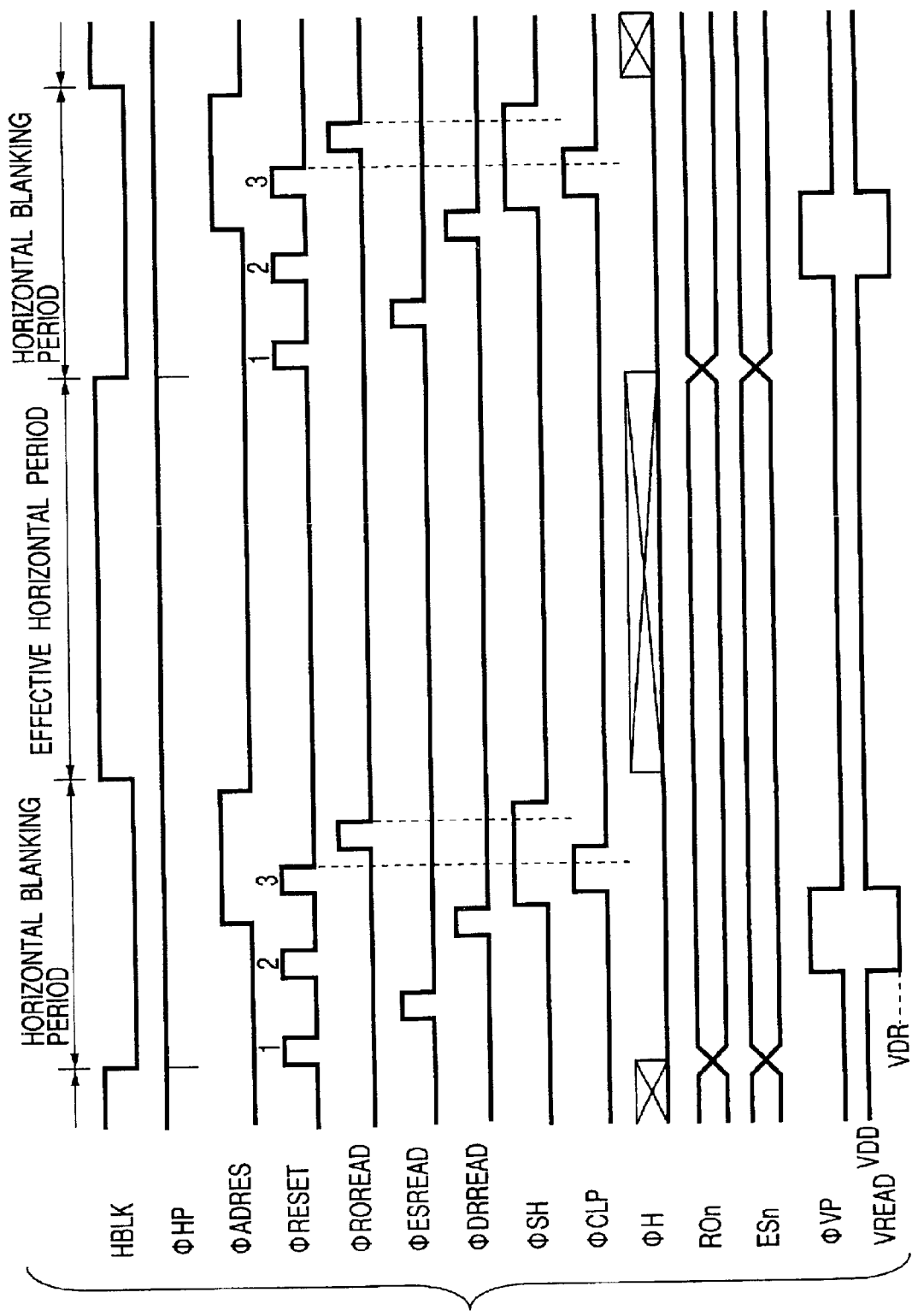
FIG. 3 is a timing waveform diagram for illustrating electronic shutter operation, dynamic range control operation, and readout operation in the CMOS image sensor of FIG. 1.

FIG. 3 is a timing waveform diagram showing the operation example of the timing generation circuit 10a, three vertical shift register 2, 20, 30 and the pulse selector 2b in FIG. 1 for explaining the electronic shutter operation, the dynamic range control (increase) operation, and the readout operation in the CMOS image sensor of FIG. 1. Here, a case where the CMOS image sensor of FIG. 1 is used by VGA (Video Graphic Array) system of one field (frame)=1/30 Hz is shown.

Upon the reception of φHP pulse, the timing generation circuit 10a provides pulses φADRES, φRESET, φESREAD, φDRREAD, φROREAD, φSH, φCLP, φVP, and also pulses HRS, HCK or the like during the horizontal blanking period.

Upon the reception of HRS pulse and HCK pulse from the timing generation circuit 10a, the horizontal shift register 3 provides sequentially φHi (i=. . . , n, n+1, . . . ) during the effective horizontal period.

The vertical shift register 20 for the electronic shutter is reset by φES as a trigger prior to the vertical shift register 30 for the dynamic range control and the readout vertical shift registers 2, and thereafter, provides ESi sequentially in synchronization with φHP. Corresponding to this ESi, the driving signal φESREADi is output to the readout line 4 from the pulse selector 2b to carry out the selection operation of the pixel row.

Thereafter, the vertical shift register 30 for the dynamic range control is reset by φDR as a trigger, and then provides DRi sequentially in synchronization with φHP. Corresponding to this DRi, the pulse selector 2b provides the driving signal φDRREADi to the readout line 4 to perform the selection operation of the pixel row.

Thereafter, the vertical shift register 2 is reset by φVR as a trigger, and then provides ROi sequentially in synchronization with φHP. Corresponding to the ROi, the pulse selector 2b provides the driving signal φROREADi to the readout line 4 to perform the selection operation of the pixel row.

Figure 4:
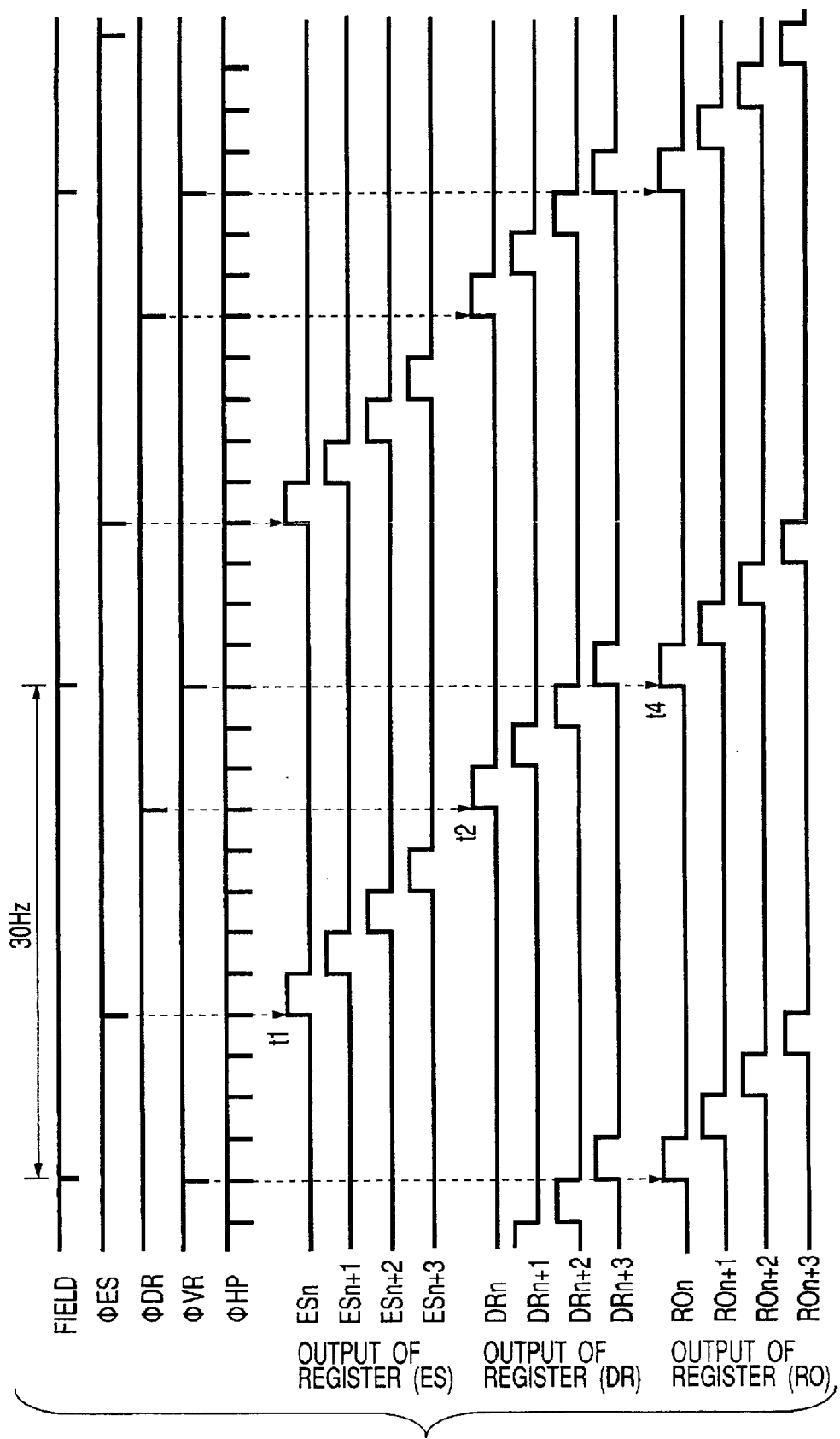
FIG. 4 is a waveform diagram showing external input pulse signals φES, φDR, φVR, φHP and respective output pulse signals ROi, ESi, DRi of the vertical shift registers of the CMOS image sensor of FIG. 1.

FIG. 4 is a waveform diagram showing external input pulse signals φES, φDR, φVR, φHP and respective output pulse signals ROi, ESi, DRi of the vertical shift registers 2, 20, 30 of the CMOS image sensor in FIG. 1.

After being reset by corresponding input pulse signals φVR, φES, φDR, the vertical shift register 2, 20, 30 carry out the shift operation in synchronization with φHP to generate output pulses ROi, ESi, DRi.

FIG. 5 is waveforms showing signals paid attention to the operation of n-th horizontal line in the imaging region of the CMOS image sensor in FIG. 1. Here, HLBK is a pseudo pulse signal for dividing one horizontal period into horizontal blanking period and effective horizontal period.

First, at the time t0, the photodiode of the n-th line converts optical signals into charges and stores the same. Next, by the time t1, the output pulse ESn of the vertical shift register 20 for the electronic shutter becomes "H" thereby to provide φRESETn and φREADn (voltage VDD at this time) from the pulse selector 2b. After this first shot φRESETn resets the signal detection node DN, all stored charges in the photodiode are read out by the first shot φREADn. From the following time t1, the photodiode stores signal charges again.

Next, the output pulse DRn of the vertical shift register 30 for the dynamic range control becomes "H" to provide φRESETn and φREADn (voltage being VDR at this time) from the pulse selector 2b. After the second shot φRESETn resets the signal detection node DN, only large signal charges equal or more than the predetermined value of charges stored in the photodiode are read out by φREADn. At this time, if no signal charges equal or more than the predetermined value are stored in the photodiode, signal charges are not read out. This operation is realized by setting the amplitude of voltage VDR of the second shot readout driving signal READn to be lower than the VDD. This operation is confirmed by the experimentation within the VDR range from 1 V to less than 3.3V, when VDD is 3.3V. From the following time t2 the photodiode stores signal charges again.

Next, the output pulse ROn of the vertical shift register 2 for to signal readout becomes "H" thereby providing φADRESn, φRESETn and φREADn (voltage VDD at this time) from the pulse selector 2b. After the third shot φRESETn resets the signal detection node DN, all stored charges in the photodiode are read out by the third shot READn. The read out stored charges are read out as a signal to the vertical signal line VLIN by φADRESn.

When ESn, DRn, ROn are not set to "H" at the same time during the same horizontal blanking period, a single shot of φRESET will operate in place of three shots, and only a single reset pulse signal φRESET in FIG. 3 may be output. Otherwise, the timing signal φESREAD from the timing generation circuit 10a can also be made common, and the driving signal φREADn during the electronic shutter operation and the driving signal φREADn during signal readout can be set to the same phase.

Figure 6:
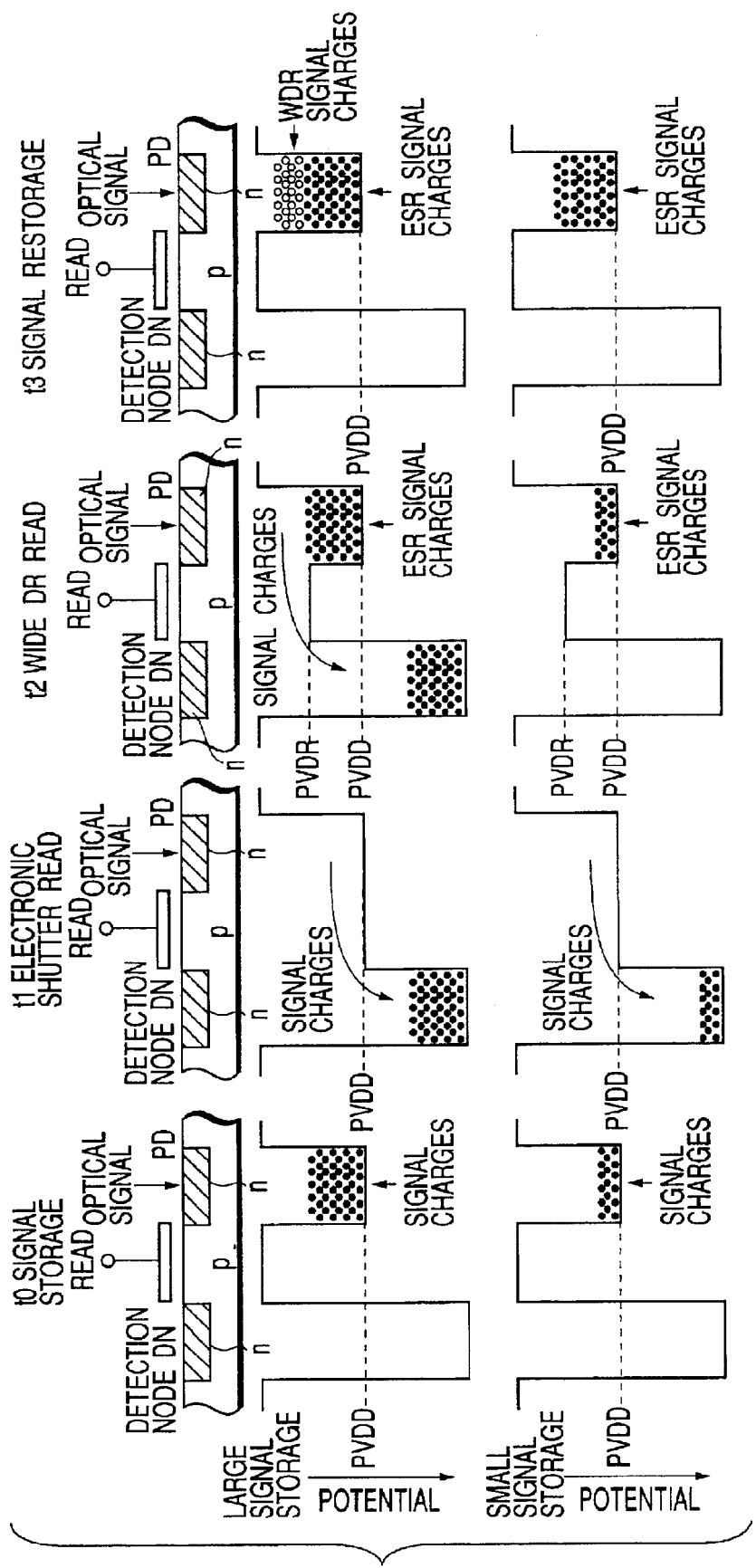
FIG. 6 shows schematically a cross sectional structure and an electric potential variation for illustrating a photodiode operation from time t0 to t3 shown in FIG. 5.

FIG. 6 shows schematically the cross sectional structure of photodiode PD, the signal detection node DN and the signal detection transistor Td provided on a semiconductor substrate and the electric potential variation for explaining the photodiode operation from time t0 to t3 shown in FIG. 5.

The signal detection node DN including the photodiode PD and n type region is formed on a silicone substrate of p well or p substrate. The signal readout transistor Td has a channel region between n type region of the photodiode PD and the signal detection node DN, and has, for example, a polysilicon gate electrode (readout gate electrode) formed thereon through a gate insulating film.

At time t0, the photodiode PD converts optical signals into charges and stores them. At the readout operation of the electronic shutter of time t1, a portion under the readout gate electrode becomes an electric potential PVDD, and all charges stored in the photodiode PD are read out into the signal detection node DN having a well of deeper potential. Then, the signal charges are stored by the photodiode PD again.

At the readout operation of the dynamic range control (increase) of time t2, a portion under the readout gate electrode becomes an electric potential PVDR. At this time, if large signal charges overflowing from the electric potential PVDR is stored in the charges of the photodiode PD, the signal charges overflowing from the electric potential PVDR is read out from the photodiode PD. On the contrary, if only the small signal charges less than the electric potential PVDR is stored in the photodiode PD, the signal charges less than the electric potential PVDR is not read out.

At the time t3 just before the readout operation, the photodiode PD stores the signal charges again, and this stored charges are the sum of ESR signal charges stored after the aforementioned electronic shutter operation and WDR signal charges stored after the dynamic range control operation.

FIG. 7 shows the characteristic of PD signal change amount with respect to the optical input signal, as an example of the photoelectric conversion characteristic of the CMOS image sensor of FIG. 1.

For the optical input signal in a small area generating signal charges up to a fixed value (KNEE point), the amount of signal charges of PD is stored with ESR signal charges given by the storage time T–STD in FIG. 5. Therefore, the gradient of the photoelectric conversion becomes large as shown by the solid line. For the optical input signal in a large area generating signal charges larger than KNEE point, as its signal charge amount is stored with WDR signal charge given by the storage time TD in FIG. 5, the gradient of the photoelectric conversion becomes small as shown by the solid line, allowing a wide dynamic (DR) operation. The gradient of the photoelectric conversion due to the storage of the ESR signal charges is determined by the storage time TS in the electronic shutter operation.

Besides, the gradient of the photoelectric conversion due to the storage of WDR signal charges can be controlled by the storage time TD of the dynamic range control operation.

As apparent from FIGS. 5 and 7, the gradient of photoelectric conversion in the ESR signal charges is large as its storage time is long, while the gradient of the photoelectric conversion in the WDR signal charges is small as its storage time is short. In other words, when the charges of the small signal are stored, its gradient of the photoelectric conversion is large as only ESR signal charges having the long storage time is stored. On the contrary, when the charges of the large signal are stored, the gradient of the photoelectric conversion becomes small for a value equal or more than a desired value (WDR signal charge), allowing, as a result, to increase the dynamic range.

Here, KNEE point corresponds to the electric potential PVDR in FIG. 6, which can be controlled by the difference between the voltages VDD and VDR of the readout driving signal φREADn. For example, it becomes possible to increase further the dynamic range by 10 times, by reducing the storage time TS in the electronic shutter operation to 1/10.

In the CMOS image sensor shown in FIG. 1, the external input pulse signals are effectively used by the timing generation circuit 10a to produce various signals. Therefore, the electronic shutter operation with a remarkably high speed can be realized at low cost without increasing the circuit scale in, for example, the pulse selector 2b and the like.

As the readout driving signal voltage for the dynamic range control, one single voltage value VDR is employed in the embodiment. However, the voltage value may be selected from a plurality of voltage values VDR1, VDR2, ... to modify the dynamic range characteristics.

Now, the mechanism of dynamic range increase will be described referring to the aforementioned FIGS. 4 to 7.

When the output of respective registers RO, DR, ES is "H" in FIG. 4, φREADN pulses of FIG. 5 are generated. In other words, when the register ES is "H", VDD1 of φREADN is generated, when the register DR is "H", VDR2 is generated, and when the register RO is "H", VDD3 is generated. According to such voltages, the signal charges stored in the photodiode PD is readout at the detection node DN. During the signal storage operation in the standard 30 Hz period, there is no output from the registers ES and DR, and only the register RO is output. Signals are stored in the signal storage operation of n-th line during 30 Hz period where it become "H". At n+1 th line, signals are stored during 30 Hz period with a delay of only one horizontal period (1H). As the operation of FIG. 6, the signal charges stored in the photodiode PD are read out to the detection node DN by φREAD pulse applied to READ gate.

On the other hand, the automatic sensitivity adjustment is carried out by the electronic shutter operation, and in the automatic sensitivity adjustment, the registers ES and RO of FIG. 4 become "H". For instance, the storage time in the photodiode PD is the time from "H" (time t1) of ESn to "H" (time t4) of ROn at n-th line. This storage time is shorter than 30 Hz. Similarly, the storage time at n+1 th line is delayed by one horizontal period (1H) and shorter than the period of 30 Hz. The storage time of t1 to t4 is constituted so as to be automatically varied according to signal amount of the object. This storage time is indicated as the time from VDD1 to VDD3 of φREADn in FIG. 5. In the electronic shutter operation, VDR2 is not generated, and VDD1 and VDD2 are of the same voltage.

As obvious from the foregoing explanation, the solid-state imaging device of the present invention includes a wide dynamic range operation in addition to the automatic sensitivity adjustment by the electronic shutter operation.

In other words, in order to carry out the wide dynamic range operation, the readout voltage switching circuit C and the register DR as shown in FIG. 1 and FIG. 4 are provided. When the register DR of FIG. 4 is "H", VDR2 which is φREAD pulse of FIG. 5 is generated. The voltage of this VDR2 is set lower than the voltage of VDD1. Further, as shown in FIG. 4, two kings of signal storage times of the photodiode PD are provided, and they are added to each other and read out. That is, the first storage time is a time from "H" (time t1) of the register ES to "H" (time t4) of RO, and the second storage time is a time from "H" (time t2) of the register DR to "H" (time t4) of RO. In the photodiode PD, these first and second storage times are added and read out to increase the dynamic range. In FIG. 5, the first storage time is shown as TS and the second storage time as TD.

The addition of storage times TS and TD in the photodiode PD will be described using FIG. 6. In FIGS. 5 and 6, the time before VDD1 of φREADn pulse is set to t0, time of VDD1 as t1, time of VDR2 as t2, time before VDD3 as t3 and time of VDD3 as t4, respectively.

As mentioned above, FIG. 6 shows the cross sectional structure of the photodiode PD having one pixel and the potential diagram, and the potential diagram shows the large signal storage operation of large optical signal amount and the low signal storage operation of small optical signal amount.

At time t0, the optical signals entered the photodiode PD are converted into charges and stored. At time t1, voltage of VDD is applied to READ gate and all signal charges stored in the photodiode PD are read out into the signal detection node DN. Thereafter, the optical signals entered the photodiode PD by the time t4 is converted into charges and stored. This period corresponds to the storage time of the electronic shutter operation.

In the large signal amount storage operation, voltage of VDR is applied to READ gate at the time t2. The voltage VDR is set to a voltage lower than the voltage VDD. PVDD and PVDR are respectively electric potentials generated by application of voltage VDD and an electric potential generated by application of voltage VDR.

When the amount of optical signals is large, the signal charges are saturated in the photodiode PD by the time t2. When the voltage VDR is applied to READ gate at the time t2, the potential under READ gate becomes PVDR. Among the signal charges of the photodiode PD, signal charges larger than the potential PVDR are read out to the detection node DN. Then, READ gate is closed to store again the signal charges in the photodiode PD.

In the small signal amount storage operation, as the signal charges stored in the photodiode PD at the time t2 are smaller than the potential PVDR, they are not read out to the detection node DN, and the storage operation is continued.

In the conventional storage operation of the large signal amount, the signal charge amount Qsig stored in the photodiode PD is substantially equal to the saturated signal charge amount Qmax determined by both the potential PVDD and the area of the photodiode PD and, as shown by the dotted line in FIG. 7, it is normally saturated at the saturated signal charge amount Qmax.

As mentioned above, according to the present invention the signal charge amount Qsig is obtained given by:

$$Qsig=Q(PVDD-PVDR)+QWDR$$

Therefore, the dynamic range is increased by increasing the signal charge amount of this QWDR. The signal charge amount Q (PVDD−PVDR) is the signal charge amount stored by he difference of PVDD potential, which is the potential of the photodiode PD, and PVDR potential, and the signal charge amount QWDR is stored during the storage time TD of wide DR in FIG. 5.

Figure 8:
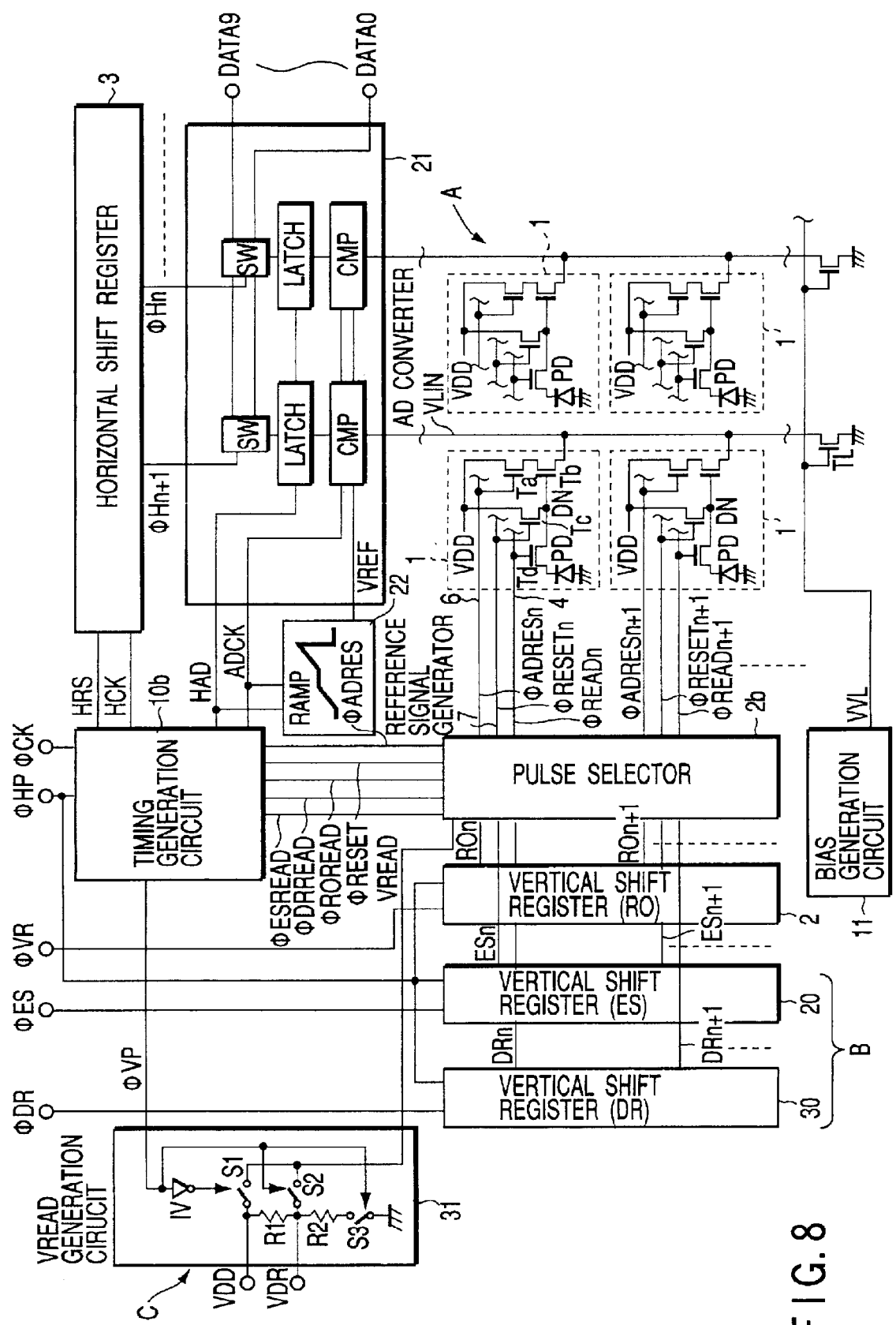
FIG. 8 is a block diagram showing schematically an amplification type CMOS image sensor according to a second embodiment of the present invention.

FIG. 8 shows schematically a circuit structure of an amplification type CMOS image sensor according to a second embodiment of the present invention.

This CMOS image sensor includes an AD conversion circuit 21 having a noise reduction function, and converts analog signal transmitted to a plurality of vertical signal line VLIN into digital signals by the AD conversion circuit 21 to provide output signals.

Now, points different from the CMOS image sensor shown in FIG. 1 will be described mainly.

Namely, in the AD conversion circuit 21 of the CMOS image sensor shown in FIG. 8, a comparator CMP connected to one end of the vertical signal line VLIN for each pixel column is disposed in the horizontal direction. This comparator CMP compares analog signals from the vertical signal line VLIN with the reference signal VREF provided from the reference signal generation circuit 22. This reference signal VREF is, basically, a RAMP wave whose voltage increases with the lapse of time. The comparator CMP counts such a timing that the signal voltage, from which noise is removed, and the reference signal VREF are balanced, and converts analog signals into 10 bit digital signals by latching the counted value.

Besides, the comparator CMP includes a sample hold capacitor (not shown) in order to obtain the difference between the reference voltage and the signal voltage similarly to the noise canceller circuit in FIG. 1 and, the signal voltage with the removed noise is produced here.

Further, within the AD conversion circuit 21, a latch circuit LATCH and a switch circuit SW are arranged in the horizontal direction so as to correspond to the comparator CMP for each pixel column respectively. The latch circuit LATCH holds 10 bit digital signals output from the comparator CMP, while the switch circuit SW reads out sequentially digital signals, held at each latch circuit LATCH, to the output signal lines DATA 0 to DATA 9 of the number corresponding to the number of bits by sequentially turning on by the driving signal (φHn pulse) supplied from the horizontal shift register 3.

A count signal ADCX and a horizontal synchronization signal HAD are input to the AD conversion circuit 21 and the reference signal generation circuit 22 from the timing generation circuit 10b, thereby controlling their operations.

External input pulse signals φVR, φES, φDR, φHP may be input directly to three vertical shift registers 2, 20, 30 as shown in the drawing. However, these external input pulse signals φVR, φES, φDR, φHP supplied at field period or horizontal period may be input to the timing generation circuit 10b to produce internal pulse signals therein, and the internal pulse signals may be applied to three vertical shift registers 2, 20, 30.

Moreover, as necessary, a command decoder circuit for receiving external command signals may be connected to the timing generation circuit lob to adjust the gain, the offset or the like of the timing generation circuit 10b or AD conversion circuit 21 by the output signals from the command decoder circuit.

In the CMOS image sensor shown in FIG. 8, for instance, the control signals output from the timing generation circuit 10b to the pulse selector 2b can be generated during the effective horizontal period of the driving signals φREADi for the electronic shutter or the dynamic range control by modifying the supply timing thereof. Therefore, since increased are degrees of freedom of changing the storage time TS of the electronic shutter operation and the storage time TD of the dynamic range control operation in FIG. 5, this may be effective on controlling the wide dynamic range operation. The reason is as follows.

Namely, when the electronic shutter pulse signal φESREAD or dynamic range control pulse signal φDRREAD is input to the pulse selector 2b during the effective horizontal period, and the readout driving signal φREADi for the electronic shutter or dynamic range control is input to the imaging area during the effective horizontal period, unwanted noise may enter the analog signals due to variation or change of the power supply voltage or ground voltage generated at that time. In order to avoid such problems, the CMOS image sensor of FIG. 8 can be provided so that the operations of the AD conversion circuit 21 and the reference signal generation circuit 22 are temporarily stopped before and after the input of electronic shutter pulse signal φESREAD or dynamic range control pulse signal φDRREAD during the effective horizontal period, based on the control by the count signal ADCK from the timing generation circuit 10b.

For example, in the CMOS image sensor as shown in FIG. 1, analog signals of one horizontal line are read out sequentially into the horizontal signal line HLIN during the effective horizontal period. In this case when external pulse signals are supplied at this time, unwanted noise may enter the analog signals depending upon the variation of the power supply voltage or ground voltage.

On the other hand, in the CMOS image sensor as shown in FIG. 8, the digital signals of one horizontal line are read out into the output signal lines DATA0 to DATA9 during the effective horizontal period after having converted the analog signals into the digital signals. Therefore, unwanted entrance of noise due to the variation of the power supply voltage or ground voltage can almost be neglected for such digital signals. As for analog signals before AD conversion, it can be possible to avoid the entrance of unwanted noise due to the variation of the power supply voltage or ground voltage by stopping temporarily the operation of AD conversion circuit 21 and the reference signal generation circuit 22, as shown by the waveform of the ramp wave RAMP in FIG. 8, before and after the input of the electronic shutter pulse signal φESREAD or dynamic range control pulse signal φDRREAD.

As for the CMOS image sensor without AD conversion circuit 21 as shown in FIG. 1, it may be possible to avoid the entrance of unwanted noise due to the variation of the power supply voltage or ground voltage, in the case where the electronic shutter pulse signal φESREAD or dynamic range control pulse signal φDRREAD are input during the effective horizontal period, by providing a correction circuit for correcting the influence of noise entering the analog signals, or by mixing circuit blocks for electrically isolated power supply, ground voltage system.

Each unit cell used for the imaging region in respective CMOS image sensors is not particularly limited to one pixel/one unit including four transistors and one photodiode PD. As unit cells, two pixel/one unit including five transistors and two photodiodes can also be employed. Further, stacked photoelectric conversion means may be used in unit cells. Moreover, various modifications are also possible without departing from the subject matter of the present invention.

As mentioned above, the solid-state imaging device according to the present invention allows to increase remarkably the dynamic range of amplification type CMOS image sensors, and to obtain an excellent image without clipping from small signals to large signals.

Additionally, the solid-state imaging device according to the present invention allows to increase remarkably the dynamic range while performing the electronic shutter operation in the amplification type CMOS image sensors, and to obtain an excellent image without clipping from small signals to large signals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid state imaging device comprising:

an imaging region including unit cells arranged in a matrix of rows and columns to provide a plurality of pixel rows, each of said unit cells having photoelectric conversion means for photoelectrically converting incident light, applied to pixels, to store signal charges, readout means for reading out stored signal charges to a detection node, and amplifying means for amplifying the readout signal;

a readout voltage switching circuit configured to set a readout driving signal, applied to said readout means, to one of a plurality of voltages different to one another according to internal control, and to set a voltage of said readout driving signal, corresponding to said readout pulse for a dynamic range increase, to a lower voltage than a voltage of a readout driving signal corresponding to a usual readout pulse; and a pulse production circuit including a vertical shift register configured to sequentially generate pulses for a dynamic range control, based on an external input pulse for said dynamic range control.

2. The solid state device according to claim 1, wherein said pulse production circuit is configured to generate in sequence a readout pulse for dynamic range increase, a pulse for an electronic shutter and a usual readout pulse.

3. The solid state imaging device according to claim 1, wherein said readout voltage switching circuit sets a voltage of said readout driving signal, corresponding to said readout pulse for a dynamic range increase, to a lower voltage than a voltage of said readout driving signal corresponding to a pulse for an electronic shutter and said voltage of said readout driving signal corresponding to said usual readout pulse.

4. A solid state imaging device comprising:

an imaging region including unit cells arranged in a matrix of rows and columns to provide a plurality of pixel rows, each of said unit cells having photoelectric conversion means for photoelectrically converting incident light, applied to pixels to store signal charges, readout means for reading out stored signal charges at a detection node, and amplifying means for amplifying the readout signal;

a plurality of readout lines provided in a horizontal direction in corresponding to each pixel row in said imaging region, said plurality of readout lines transmitting a readout driving signal for driving each readout means of said unit cells in a corresponding pixel row respectively;

a pulse production circuit for producing a plurality of pulses for respective pixel rows as pulse signals for controlling readout timing in said plurality of pixel rows;

a readout voltage switching circuit for setting a voltage of said readout driving signal, applied to said readout means in correspondence to a part of pulse in said plurality of pulses, to a voltage differ from said voltage of said readout driving signals, applied to said readout means in correspondence to the other pulse in said plurality of pulses;

a vertical shift register for sequentially producing pulses for a dynamic range control, based on an external input pulse for said dynamic range control; and a plurality of vertical signal lines, provided in correspondence to respective pixel columns in said imaging region, for transmitting a signal provided from said unit cells of said each pixel row in a vertical direction.

5. The solid state imaging device according to claim 4, wherein said pulse production circuit generates in sequence a readout pulse for a dynamic range increase and a usual readout pulse as said plurality of pulses, and wherein said readout voltage switching circuit sets a voltage of said readout driving signal, corresponding to a readout pulse for said dynamic range increase, to a lower voltage than a voltage of said readout driving signal corresponding to said usual readout pulse.

6. The solid state imaging device according to claim 4, wherein said pulse production circuit generates in sequence a readout pulse for an electronic shutter, a readout pulse for a dynamic range increase and a usual readout pulse as said plurality of pulses, and wherein said readout voltage switching circuit sets a voltage of said readout driving signal, corresponding to a readout pulse for said dynamic range increase, to a lower voltage than a voltage of said readout driving signal corresponding to said readout pulse for said electronic shutter.

7. The solid state imaging device according to claim 4, further including:

vertical driving means for selectively supplying said readout driving signal to said plurality of readout lines in correspondence to said plurality of pulses supplied from said pulse production circuit, thereby driving said readout means of each pixel row in said imaging region for several times.

8. The solid state imaging device according to claim 7, wherein said vertical driving means provides a plurality of readout driving signals, corresponding to respective said plurality of pulses, during any horizontal driving periods.

9. The solid state imaging device according to claim 7, further including:
   AD converter for converting signals, transmitted to said plurality of vertical signal lines, to digital signals;
   said vertical driving means providing at least one of said readout driving signal, corresponding to said plurality of pulses, during effective horizontal periods; and
   said AD converter being controlled in such a manner that signal conversion is stopped when said readout driving signal is provided during said effective horizontal periods.

10. The solid state imaging device according to claim 7, wherein said imaging region further includes reset means for resetting a detection node for reading signal charges stored at said photoelectric conversion means, and
   wherein said vertical driving means supplies a reset signal for driving said reset means prior to said read driving signal.

* * * * *